US006812809B2

(12) United States Patent
Koukkari

(10) Patent No.: US 6,812,809 B2
(45) Date of Patent: Nov. 2, 2004

(54) METHOD OF TUNING A SUMMING NETWORK

(75) Inventor: Eero Koukkari, Oulu (FI)

(73) Assignee: Nokia Corporation, Espoo (FI)

( * ) Notice: Subject to any disclaimer, the term of this patent is extended or adjusted under 35 U.S.C. 154(b) by 40 days.

(21) Appl. No.: 10/169,833

(22) PCT Filed: Nov. 12, 2001

(86) PCT No.: PCT/FI01/00979
§ 371 (c)(1),
(2), (4) Date: Dec. 18, 2002

(87) PCT Pub. No.: WO02/39536
PCT Pub. Date: May 16, 2002

(65) Prior Publication Data
US 2003/0155992 A1 Aug. 21, 2003

(30) Foreign Application Priority Data
Nov. 13, 2000 (FI) .............................. 20002482

(51) Int. Cl.[7] .............................................. H01P 1/213
(52) U.S. Cl. ..................... 333/126; 333/129; 333/132
(58) Field of Search ............................... 333/100, 17.3, 333/124–129, 132–137

(56) References Cited

U.S. PATENT DOCUMENTS

| 5,229,729 A | * | 7/1993 | Nishikawa et al. | 333/126 |
|---|---|---|---|---|
| 5,440,281 A | * | 8/1995 | Wey et al. | 333/126 |
| 5,584,058 A | * | 12/1996 | Arnold | 455/103 |
| 5,608,364 A | | 3/1997 | Hirai et al. | 333/204 |
| 5,638,034 A | | 6/1997 | Heikkilaet et al. | 333/17.1 |
| 5,689,219 A | * | 11/1997 | Piirainen | 333/127 |
| 5,831,490 A | * | 11/1998 | Sarkka et al. | 333/126 |
| 5,949,302 A | | 9/1999 | Sarkka | 333/126 |
| 6,005,453 A | | 12/1999 | Sarkka et al. | 333/126 |
| 6,140,888 A | * | 10/2000 | Sarkka et al. | 333/126 |
| 6,518,856 B1 | * | 2/2003 | Casale et al. | 333/124 |
| 6,545,564 B1 | * | 4/2003 | Coppola | 333/124 |

FOREIGN PATENT DOCUMENTS

| EP | 614 243 | 9/1994 |
| FI | 87409 | 12/1992 |
| FI | 92964 | 1/1995 |

\* cited by examiner

*Primary Examiner*—Barbara Summons
(74) *Attorney, Agent, or Firm*—Pillsbury Winthrop LLP

(57) ABSTRACT

The present invention relates to a summing network comprising: a summing point (P) having interfaces for coupling summing network branches to the summing point, and an interface for coupling the summing point (P) to an antenna (ANT), and channel units (TX1 to TX3) arranged in the branches, and channel unit-specific band-pass filters (1 to 3), whose pass frequencies correspond to the frequency or frequencies of the corresponding channel unit. To facilitate tuning the summing network, a compensation element (7) is coupled to the summing network between the summing point (P) and the antenna (ANT), the load effect of said compensation element corresponding substantially to the load caused to the summing point (P) by the branches coupled to the summing point.

11 Claims, 3 Drawing Sheets

METHOD OF TUNING A SUMMING NETWORK

Figure 1:
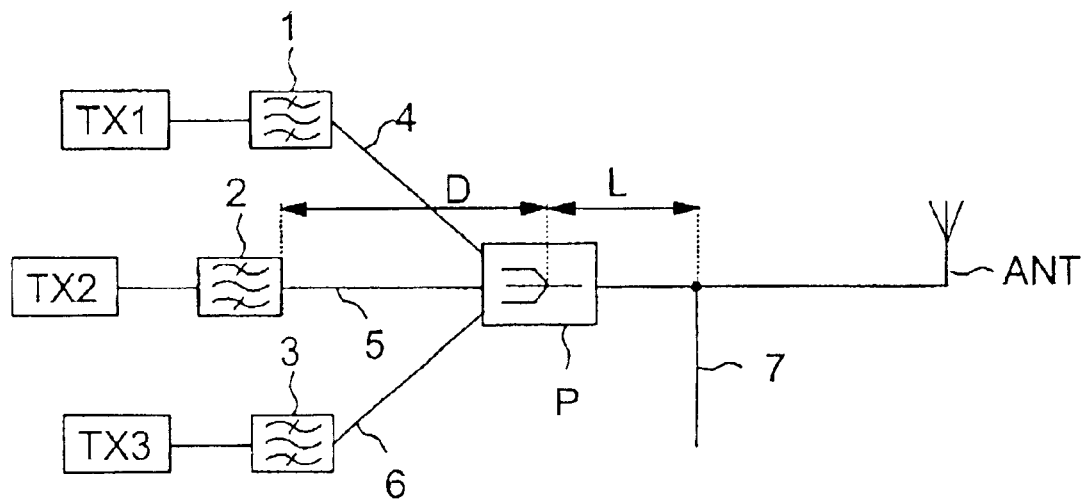

This is U.S. National Stage of International Application No. PCT/FI01/00979, which was filed in the English language on Nov. 12, 2001, and which designated the U.S.

The present invention relates to a summing network and particularly to dimensioning a summing network to optimize performance.

A summing network is used, e.g., in base stations in mobile systems for combining the base station's transmitter branches to a common transmission antenna. In the following, the invention will be described by way of example by specifically referring to the summing network of a base station, although the invention is also applicable to other summing networks.

In a base station summing network, each transmitter branch comprises a transmitter and a narrowband band-pass filter, whose pass frequency corresponds to the transmission frequency used by the transmitter. Band-pass filters, i.e. combiner filters, prevent transmitters from interfering with each other's functioning. In practice, each band-pass filter is usually tuned to the intermediate frequency of the corresponding transmitter in such a way that it passes the signal transmitted by the corresponding transmitter with a minimum loss to the summing network, and simultaneously prevents the signals of other transmitter at different frequencies from passing to the corresponding transmitter.

In order for a maximally large portion of the transmission power of the transmitters to be transferred to an antenna, the summing network has to be tuned with respect to the frequency channels used by the base station transmitters. The optimal electrical length of a summing network depends on the wavelength of the carrier of the signal to be transmitted. Strictly taken, a summing network is thus tuned only at one frequency. A summing network is generally tuned to the middle of the available frequency band, i.e. the M-frequency. In this case, the cables of the summing network with which the band-pass filters of the transmitter branches are coupled to the summing point are usually selected so that their length is $\lambda/2$, wherein $\lambda$ is the wavelength at the M-frequency.

When moving away from the optimum frequency, i.e. usually the M-frequency, to the lower end of the available frequency band to the B-frequency or to the upper end to the T-frequency, the electrical lengths of the cables used no longer correspond to the value $\lambda/2$, i.e. the electrical length of the cables is wrong. This causes load to the summing point, i.e. reactive mismatching. This load causes impaired reflection loss and pass loss, as well as narrowing of the bandwidths of the combiner filters.

In practice, the optimal frequency band of a summing network is too narrow to allow the frequency channels of the base station transmitters to be changed very much without having to deal with the tuning of the summing network. However, in practice, the frequency channels of base stations in mobile systems, for example, need to be changed between the B-frequency and the T-frequency. Automatically (by remote control) tuneable combiner filters becoming common, the need arises to facilitate the tuning of a summing network. A previously known solution, wherein an engineer visits the site of the base station and replaces the cabling of the summing network with cabling tuned to a new frequency band, is a too expensive and time consuming task.

Solutions are also previously known, wherein the summing network is provided with remotely controlled adjusting elements enabling the re-tuning of the summing network. However, these adjusting elements are relatively complex, and their manufacture and management increase costs.

The object of the present invention is to solve the above problem and to provide a solution that facilitates the tuning of a summing network. This object is achieved by the method of tuning a summing network according to the invention. The method of the invention is characterized by determining the load caused to a summing point by summing network branches, selecting a compensation element whose load effect corresponds substantially to the load caused to the summing point by the summing network branches, and coupling said compensation element to the summing network between the summing point and an antenna.

If the summing point is coupled via a conductor directly to the antenna, the compensation element can be coupled between the summing point and the antenna by coupling it to a conductor connecting them. However, if the summing point in a summing network is coupled to the antenna via another component (or other components), the compensation element is coupled between the summing point and the following component to a conductor connecting them. The term conductor refers to a transfer line for transferring signals between components. It may thus be e.g. a coaxial cable, a microstrip conductor or the like.

The invention also relates to a summing network comprising: a summing point having interfaces for coupling summing network branches to the summing point, and an interface for coupling the summing point to an antenna, and channel units arranged in the branches, and channel unit-specific band-pass filters, whose pass frequencies correspond to the frequency or frequencies of the corresponding channel unit. The summing network of the invention is characterized in that a compensation element is coupled to the summing network between the summing point and the antenna, the load effect of said compensation element corresponding substantially to the load caused to the summing point by the branches coupled to the summing point.

The invention is based on the idea of arranging a compensation element, whose load effect is substantially the same as the load caused to the summing point by the summing network branches, in the summing network between the summing point and the antenna. The use of such a compensation element eliminates the need to retune the summing network when the frequency channels of the channel units are changed. This is because the compensation element compensates for the mismatching caused by the electrical length of the summing network branches no longer being optimal in the new frequency band.

In this context, the concept channel unit refers to a transmitter, a receiver or a combination thereof. The solution of the invention is applicable for use both in a summing network in transmission use and in a summing network in reception use. A summing network in transmission use is used to sum the transmitter signals and apply them to a common transmission antenna. A summing network in reception use is used to branch signals received with the common antenna to the different receivers. In accordance with the invention, the summing point may be coupled either directly with a conductor to the antenna or, alternatively, via another component (or other components) to the antenna. An alternative is for the summing point to be coupled to the antenna via another summing point.

The most significant advantage of the method and summing network of the invention is thus that the cabling connecting the summing network branches to the summing point does not have to be replaced and the summing network does not need any other kind of tuning even if the frequencies of the channel units in the base station are changed.

In accordance with the invention, at its simplest, the compensation element could be a conductor whose length corresponds substantially to the total length of the conductors connecting the pass-band filters to the summing point. A significant additional advantage achieved by such a solution is a temperature-compensated summing network. This is because changes due to the change in the temperature of the conductor connecting the branches to the summing point and the conductor of the compensation element compensate for each other.

If the pass loss of the summing network is to be less than is achieved when a conductor is used as the compensation element, the compensation element can be a resonator, comprising e.g. a capacitor and a coil. In this case, the first poles of the capacitor and the coil are coupled to the connector between the summing point and the antenna, and the second poles are grounded.

The preferred embodiments of the invention are disclosed in the attached dependent claims 2 to 3 and 5 to 12.

Figure 2:
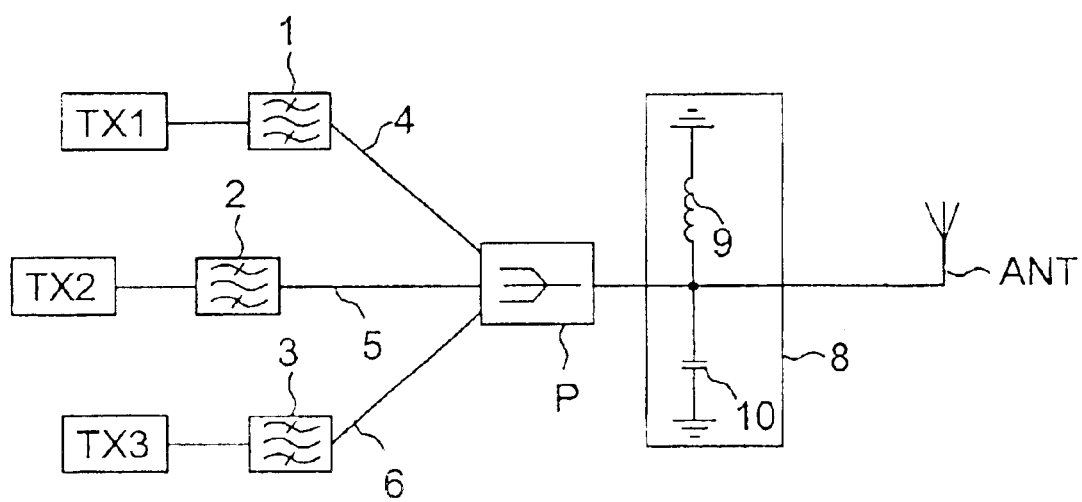
Figure 3:
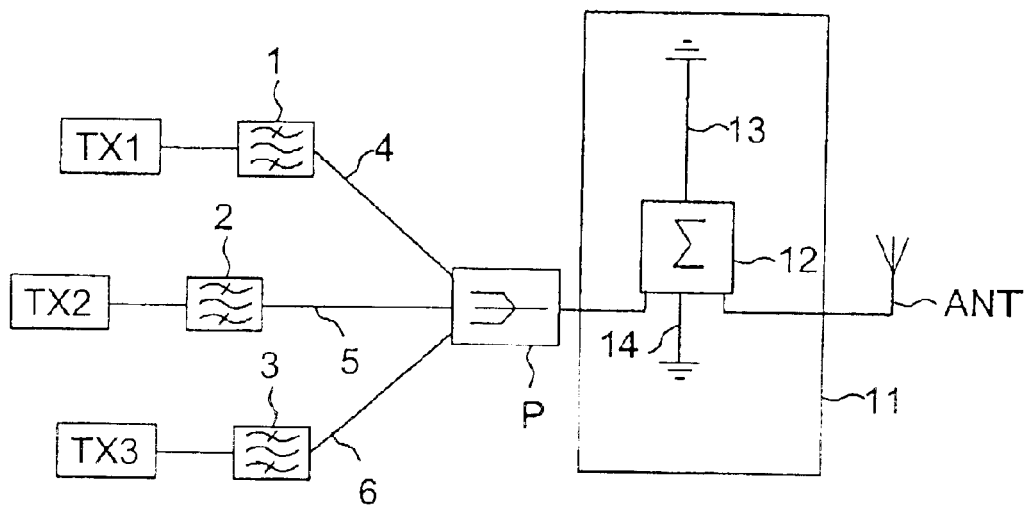
Figure 4:
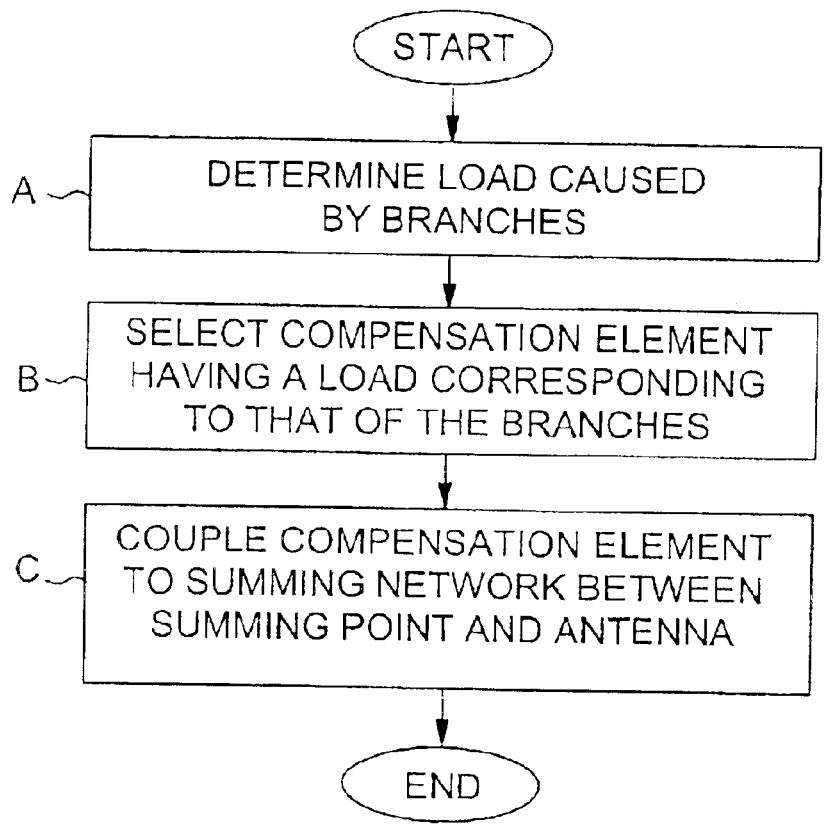
Figure 5:
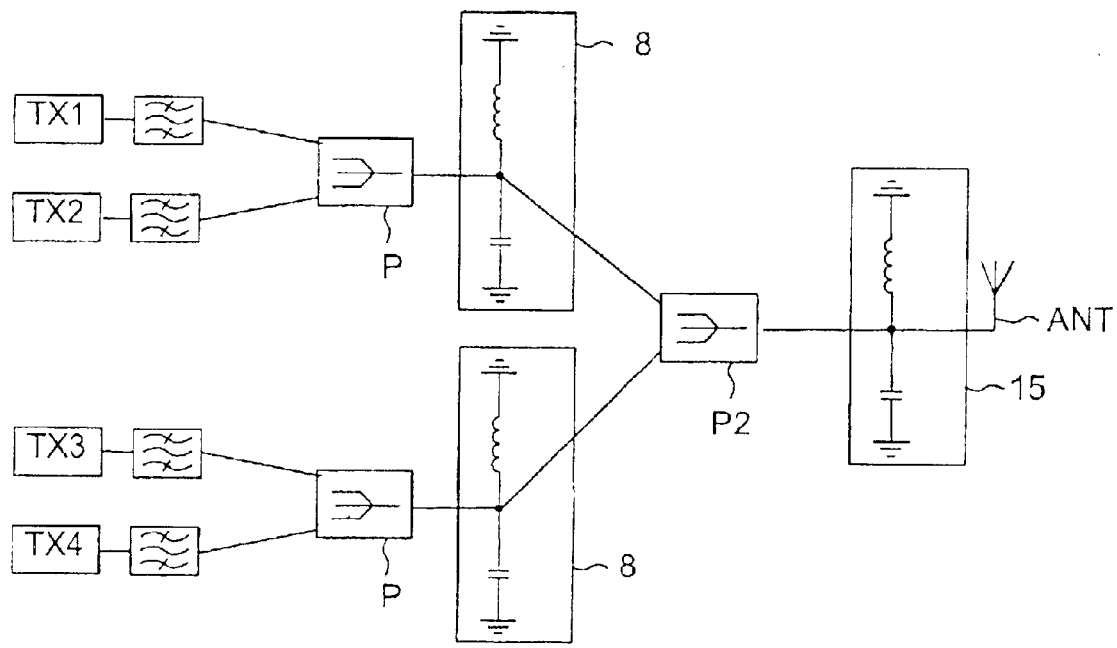
Figure 6:
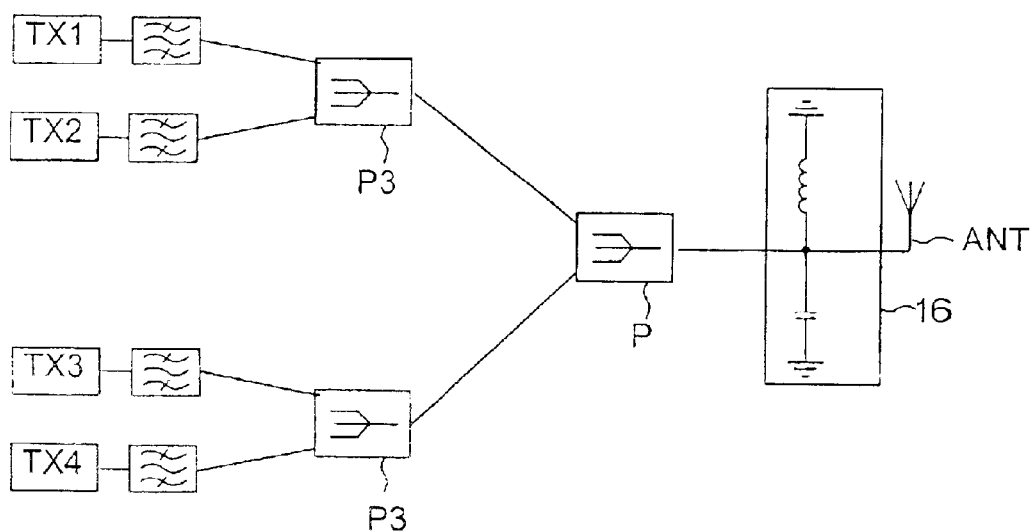

In the following, the invention will be described by way of example with reference to the attached figures, of which FIG. 1 is a block diagram of a first preferred embodiment of the summing network of the invention, FIG. 2 is a block diagram of a second preferred embodiment of the summing network of the invention, FIG. 3 is a block diagram of a third preferred embodiment of the summing network of the invention, FIG. 4 is a flow diagram of a first preferred embodiment of the method of the invention, FIG. 5 is a block diagram of a fourth preferred embodiment of the summing network of the invention, and FIG. 6 is a block diagram of a fifth preferred embodiment of the summing network of the invention.

FIG. 1 is a block diagram of a first preferred embodiment of the summing network of the invention. The summing network in FIG. 1 may be e.g. a summing network of a base station in a mobile system, the network serving as means to couple channel units TX1 to TX3 of different summing network branches to a common antenna ANT. The channel units TX1 to TX3 may be receivers, transmitters or combinations thereof. However, in the following the assumption is by way of example that the channel units TX1 to TX3 are transmitters whose signals are combined by the summing network and applied to a common transmission antenna.

In the case of FIG. 1, the summing network of a base station comprises three branches each including a channel unit TX1 to TX3 and a band-pass filter 1 to 3. In practice, the number of branches may naturally deviate from the exemplary case of FIG. 1, which includes three of them. The pass frequency of each band-pass filter 1 to 3 is adjusted to correspond to the frequency or frequencies used by the corresponding channel unit. This means that e.g. band-pass filter 1 passes the transmission-frequency signals produced by channel unit TX1 to the summing network, while it simultaneously prevents the signals produced by the other channel units TX2 and TX3 from passing to channel unit TX1. Band-pass filters 1 to 3 are connected to summing point P with conductors 4 to 6. In this context, conductors refer to transfer lines for transferring signals from one component to another, i.e. coaxial cables or microstrip conductors, for example. At summing point P, the signals produced by the different transmitters are combined and applied further to the common antenna ANT.

The assumption in the case of FIG. 1 is that the base station transmitters can be tuned to frequencies belonging to three different frequency ranges, i.e. the B-range (the lowest frequency), the M-range (the intermediate frequency) and the T-range (the highest frequency). When the frequencies of a base station are changed, a frequency channel in a selected frequency range is given to the use of each transmitter. During manufacture of the base station summing network, conductors 4 to 6 are so dimensioned that a given branch does not load the channel units of the other branches. This is achieved when the length of the conductors is $D=\lambda/2$, wherein $\lambda$ is the wavelength at the M-frequency. Accordingly, the summing network is optimally tuned in the M-frequency range.

In order not to have to retune the summing network during frequency change, a compensation element 7 is added to the summing network. In the embodiment of FIG. 1, compensation element 7 is composed of a conductor whose length corresponds to the total length of conductors 4 to 6, and whose electrical characteristics correspond to the electrical characteristics of conductors 4 to 6. In the case of FIG. 1, compensation element 7 is arranged at distance L from the summing point. Distance L is so selected that $L=\lambda/4+n*\lambda/2$, wherein $\lambda$ is the wavelength at the intermediate frequency of the frequency band of the base station, and n is a positive integer or zero.

If base station transmitter frequencies are changed lower, i.e. to the B-range, signal wavelengths change such that the signal wavelength no longer corresponds to the length of conductors 4 to 6. The cable length error caused by a frequency change affects summing point P causing it an inductive load. When moving to distance L from summing point P, the reactive impedances visible at the summing point take an opposite sign. This summing network impedance change that turns into capacitance can be compensated for with compensation element 7, which thus causes an inductive load of a corresponding magnitude.

Similarly, when base station transmitter frequencies are changed higher, i.e. to the T-range, signal wavelengths change such that they no longer correspond to the length of conductors 4 to 6. The conductor length error caused by the frequency change affects summing point P causing it a capacitive load that changes into inductance when moving to distance L from summing point P. Since the load caused by the compensation element corresponds to the load caused to the summing point by the branches, this capacitive load compensates for the branch impedance change that turned into inductance.

If compensation element 7 used as described above is a conductor whose electrical characteristics and length correspond to the lengths of conductors 4 to 6, with which band-pass filters 1 to 3 are coupled to the summing point, then the solution simultaneously achieves temperature compensation for the summing network. This is because the changes caused by temperature changes to the electrical characteristics are balanced on the different sides of the summing point.

FIG. 2 is a block diagram of a second preferred embodiment of the summing network of the invention. The embodiment of FIG. 2 corresponds to the case of FIG. 1 in other respects, except that it uses a different compensation element. In the case of FIG. 2, the compensation element used is a coil 9 and a capacitor 10, whose first poles are coupled to a conductor between summing point P and the antenna ANT, and second poles are grounded. Compensation element 8 thus serves as a resonator circuit for the intermediate frequency of the frequency band used.

FIG. 3 is a block diagram of a third preferred embodiment of the summing network of the invention. The embodiment of FIG. 3 also corresponds to the case of FIG. 1 in other respects, except that it uses a different compensation element. In the embodiment of FIG. 3, compensation element 11 comprises a summing element 12, e.g. similar to summing point P. The actual signal passes directly through summing element 12. In the case of FIG. 3, a short open stub 14 acting as capacitance and a longer stub 13 acting as inductance are connected to summing element 12. In practice, stubs 13 and 14 may be composed of conductors of a given length and be dimensioned such that the conductors are in parallel resonance at the M-frequency. At the B-frequency, the coupling is visible as transverse inductance, and at the T-frequency as transverse capacitance.

The length of stubs 13 and 14 determines whether they act as inductance or capacitance. If the stub is closed at its end (grounded), it acts as inductance if its length is between (0 to $\lambda/4$)+$n*\lambda/2$, and as capacitance if its length is ($\lambda/4$ to $\lambda/2$)+$n*\lambda/2$. If, again, the stub is open (its end is not grounded), its acts as inductance if its length is between ($\lambda/4$ to $\lambda/2$)+$n*\lambda/2$, and as capacitance if its length is (0 to $\lambda/4$)+$n*\lambda/2$.

Instead of one stub acting as capacitance and one stub acting as inductance being coupled to summing element 12, several parallel stubs acting as capacitance and/or several parallel stubs acting as inductance may be coupled thereto. In some cases, this provides a solution having even smaller losses than before.

FIG. 4 is a flow diagram of a first preferred embodiment of the method of the invention.

In FIG. 4, in block A, the load caused to the summing point by the summing network branches is determined. This may be accomplished e.g. by finding out the inductive reactance and capacitive reactance caused by the branches.

In block B, a compensation element having a load corresponding to that caused by the branches to the summing point is selected. A suitable compensation element is e.g. a resonator whose transverse load is reactive and increases from the B-range to the M-range from inductive to infinite, and decreases from infinite to capacitive when moving from the M-range to the T-range. At its simplest, a conductor may be selected that has the same corresponding length as the conductors connecting the pass-band filters of the branches to the summing point, and whose electric characteristics correspond to those of the conductors connecting the band-pass filters to the summing point.

In block C, the compensation element is coupled to the summing network between the summing point and the antenna. In this case, distance L to the summing point is preferably selected so that $L=\lambda/4+n*\lambda/2$, when $\lambda$ is the wavelength and n is a positive integer or zero.

FIG. 5 is a block diagram of a fourth preferred embodiment of the summing network of the invention. The embodiment of FIG. 5 largely corresponds to that of FIG. 2. In the case of FIG. 5, however, the summing network comprises two corresponding summing points P, to both of which two branches are coupled. If the assumption is, by way of example, that FIG. 5 shows a summing network in transmission use, then summing points P combine signals produced by channel units TX1 to TX2 and TX3 to TX4, respectively, comprised by the branches.

In the case of FIG. 5, summing points P are not directly coupled to the antenna ANT, as is the case in FIG. 2 as regards summing point P. Instead, summing points P are coupled to the antenna ANT via a second summing point P2. In other words, the compensation elements 8 of the summing points are arranged between summing points P and the second summing point P2. In addition, a second compensation element 15 is arranged between the second summing point P2 and the antenna ANT. This second compensation element 15 compensates for the load caused to the second summing point P2 from the direction of the branches. The electric length of the conductors connecting summing points P and P2 is $\lambda/2+n*\lambda/2$.

The second compensation element 15 is coupled at distance $L=\lambda/4+n*\lambda/2$ from the second summing point P2, whereby $\lambda$ is the wavelength at the intermediate frequency of the base station frequency band, and n is a positive integer or zero. Although FIG. 5 describes, by way of example, that the second compensation element is composed of a combination of a coil and a capacitor, another type of compensation element may also be used as the second compensation element instead of this alternative.

FIG. 6 is a block diagram of a fifth preferred embodiment of the summing network of the invention. In the embodiment of FIG. 6, the summing network branches comprise summing points P3, via which the band-pass filters of the branches are coupled to summing point P. As distinct from the case of FIG. 6, one or more channel units may also be coupled to summing point P directly via a channel unit-specific band-pass filter, i.e. without such a branch being coupled to summing point P via summing points P3.

The electrical length of the conductors connecting summing points P3 and P is $\lambda/2+n*\lambda/2$. A compensation element 16 is arranged between summing point P and the antenna ANT for compensating for the load caused to summing point P by the branches. The compensation element 16 is thus so dimensioned that it causes the summing point a load that corresponds to the total load caused to summing point P from the direction of the branches and includes the load caused by both the conductors and summing points P3.

Although the description of FIG. 6 states by way of example that compensation element 16 is composed of a combination of a coil and a capacitor, another type of compensation element may also be used as compensation element 16 instead of this alternative.

It is to be understood that the above specification and the related figures are only intended to illustrate the present invention. Different variations and modifications of the invention are apparent to those skilled in the art, without deviating from the scope and spirit of the invention disclosed in the attached claims.

What is claimed is:

1. A method of tuning a summing network comprising:
   determining the load caused to a summing point by summing network branches,
   selecting a compensation element whose load effect corresponds substantially to the load caused to the summing point by the summing network branches, and
   coupling said compensation element to the summing network between the summing point and an antenna at an electrical distance L from the summing point such that $L=\lambda/4n*\lambda/2$, wherein $\lambda$ is the wavelength at the intermediate frequency of the frequency band of a base station, and n is a positive integer or zero.

2. A method of tuning a summing network comprising:
   determining the load caused to a summing point by summing network branches,
   selecting a compensation element whose inductive reactance and capacitive reactance substantially correspond to the inductive reactance and capacitive reactance caused to the summing point by the branches, and
   coupling said compensation element to the summing network between the summing point and an antenna.

3. A summing network comprising:

a summing point having interfaces for coupling summing network branches to the summing point, and an interface for coupling the summing point to an antenna, channel units arranged in the branches, and channel unit-specific band-pass filters, whose pass frequencies correspond to the frequency or frequencies of the corresponding channel unit, and wherein a compensation element is coupled to the summing network between the summing point and the antenna, the load effect of said compensation element corresponding substantially to the load caused to the summing point by the branches coupled to the summing point.

4. A summing network as claimed in claim 3, wherein the branches of the summing network comprise further summing points via which the band-pass filters are coupled to said summing point.

5. A summing network as claimed in claim 3, wherein the inductive reactance and capacitive reactance of the compensation element correspond substantially to the inductive reactance and capacitive reactance caused to the summing point by the branches.

6. A summing network as claimed in claim 3, wherein the compensation element is coupled between the summing point and the antenna at an electrical distance L from the summing point such that $L=\lambda/4+n*\lambda/2$, wherein $\lambda$ is the wavelength at the intermediate frequency of the frequency band of a base station, and n is a positive integer or zero.

7. A summing network as claimed in claim 3, wherein the compensation element is composed of a conductor whose length corresponds substantially to the total electrical length of conductors connecting the band-pass filters to the summing point.

8. A summing network as claimed in claim 3, wherein the compensation element is composed of a capacitor and a coil whose first poles are coupled to a connector between the summing point and the antenna, and whose second poles are grounded.

9. A summing network as claimed in claim 3, wherein the compensation element is composed of a resonator.

10. A summing network as claimed in claim 3, wherein the compensation element is composed of a summing element to whose interfaces are coupled at least one stub acting as inductance and at least one stub acting as capacitance, the stubs being dimensioned such that they are in resonance at the intermediate frequency of a base station's frequency band.

11. A summing network as claimed in claim 3, wherein said summing point is coupled to said antenna via a second summing point, and that a second compensation element is coupled between the second summing point and the antenna, the load of the second compensation element corresponding substantially to the load caused to the second summing point from the direction of the branches.

* * * * *